United States Patent [19]

Abraham

[11] Patent Number: 4,531,113
[45] Date of Patent: Jul. 23, 1985

[54] CAPACITOR ARRAY

[75] Inventor: Leonard G. Abraham, Stow, Mass.

[73] Assignee: GTE Laboratories Incorporated, Waltham, Mass.

[21] Appl. No.: 508,363

[22] Filed: Jun. 27, 1983

[51] Int. Cl.³ .............................................. H03K 13/02
[52] U.S. Cl. ........................ 340/347 C; 340/347 AD
[58] Field of Search ..................... 340/347 AD, 347 C

[56] References Cited

U.S. PATENT DOCUMENTS

| 4,028,694 | 6/1977 | Cook et al. | 340/347 AD |
| 4,077,035 | 2/1978 | Yee | 340/347 AD |
| 4,129,863 | 12/1978 | Gray et al. | 340/347 AD |
| 4,195,282 | 3/1980 | Cameron | 340/347 AD |
| 4,200,863 | 4/1980 | Hodges | 340/347 AD |
| 4,404,544 | 9/1983 | Dwarakanath | 340/347 C |
| 4,476,456 | 10/1984 | Domogalla | 340/347 AD |

Primary Examiner—B. Dobeck
Attorney, Agent, or Firm—Fred Fisher

[57] ABSTRACT

A capacitor array for a companded pulse code modulation voice codec includes a first plurality of capacitors having a common capacitance C each. A plurality of switching means individually and selectively couple one plate of each of the capacitors to a first point of reference potential or to a second point of reference potential. A second plurality of capacitors has a common capacitance 2C, each, which is coupled in series to form a plurality of junctions, each of the junctions being coupled to a separate one of second plates of the first plurality of capacitors.

12 Claims, 7 Drawing Figures

CAPACITOR ARRAY

BACKGROUND OF THE INVENTION

1. Field of the Invention

This invention relates to a new and improved capacitor array and, in particular, to a new and improved capacitor array for a companded pulse-code modulation voice codec. Accordingly, it is a general object of this invention is provide a new and improved array of such character.

2. Description of the Prior Art

Voice signals can be coded in a non-linear digital code for digital telephone transmission in order to maintain a high ratio of signal-to-noise over a wide signal level range without requiring excessive digital transmission bandwidth. One widely used code in the United States is the 15 segment approximation of the $\mu=255$ compression law. An analog signal, such as speech, can be converted into a digital coded output using an 8-bit pulse-code modulation format in which, in each of the 15 segments, there are 16 equal steps (with the exception of the segment passing through the origin which contains 31 equal steps). In such case, a standard sampling rate for voice signals is 8 kilohertz, resulting in a 64 kilobits PCM signal.

Cameron, in U.S. Pat. No. 4,195,282, entitled "Charge Redistribution Circuits", utilizes a binary weighted capacitor array wherein the various capacitors are related to each other by the ratios of 1, 2, 4, 8, 16, 32, 64, and 128.

With such an exponential relationship, problems tend to occur with edge effects in the production of integrated circuits in that a 32 or 64 unit capacitor might not be thirty-two or sixty-four times as large as a smaller one, because of that edge effect. If one were to actually construct, for example, a 16 size capacitor by joining together a group of sixteen one unit capacitors, the fabrication required would be undesirably complicated. A limit to such a scheme would be to what extent a significant ratio could actually be fabricated on a practical basis.

SUMMARY OF THE INVENTION

It is another object of this invention to provide a new and improved capacitor array which can be manufactured with facility.

Yet another object of this invention is to provide a new and improved capacitor array for use in a companded pulse-code modulation voice codec in which the values of the capacitances that are used do not exceed two in number.

Still another object of this invention is to provide a new and improved capacitor array for use in a companded pulse-code modulation voice codec, which array is reliable, efficient and inexpensive.

In accordance with one aspect of the invention, a capacitor array for a companded pulse-code modulation voice codec includes a first plurality of capacitors each having a common capacitance, each of the capacitors having a pair of plates. A plurality of switching means are provided for individually and selectively coupling the first plates of the capacitors to either a first point of reference potential or to a second point of reference potential. Each of a second plurality of capacitors has a common capacitance that is twice in value to that of each of the first capacitors. Each of the second plurality of capacitors is coupled in series to form a plurality of junctions, wherein each junction is coupled to a separate one of the second plates. In accordance with certain features of the invention, means are provided for preventing a charge buildup on junctions of the second plurality of capacitors. They can include a plurality of MOS transistors with drain electrodes coupled to respective junctions, with source electrodes coupled to the first point of reference potential, and with the gate electrodes coupled to an enabling signal. Distributive stray capacitance can be present between the output of the second plurality of capacitors and the first point of reference potential without material effect.

Another aspect of the invention includes a capacitor array for a companded pulse-code modulation voice codec. That includes a first plurality of capacitors having a common capacitance C, each, wherein each of the capacitors has a pair of plates. A plurality of switching means is provided for individually and selectively coupling the first plates of the capacitors to a first point of reference potential of a given plurality or to a second point of reference potential. A first capacitor has a like capacitance having a first plate coupled to the second point of reference potential and having a second plate. A second capacitor has a like capacitance having a first plate adapted to be coupled to a third point of reference potential, equal in magnitude but opposite in polarity to that of the first point of reference potential. A third capacitor has a like capacitance having a pair of plates. A first switch has an arm coupled to the first plate of the third capacitor, the arm being adapted to be coupled to either a first terminal or a second terminal. Means are provided for coupling the second plates of the first capacitor and the second capacitor together at a first coupling point. The second plate of one of the first plurality of capacitors and the second plate of the third capacitor are coupled together at second coupling point. Each of a second plurality of capacitors has a common capacitance that is twice the value of that of each of the foregoing plurality of capacitors. The second plurality of capacitors is coupled in series to form a plurality of junctions, each of which is coupled to a respective one of the second plates of the first plurality of capacitors and to the second capacitor. A second switch has an arm coupled to the second coupling point and is adapted to be coupled to the second point of reference potential. The first switch and the second switch are so ordered that when the arm of the first switch is coupled to the first terminal, the arm of the second switch is open circuited, and when the arm of the first switch is coupled to the second terminal, the arm of the second switch is coupled to the second point of reference potential. Means are provided for coupling the first terminal to the second point of reference potential; the second terminal is adapted to receive an input signal. In accordance with certain features of the invention, the capacitor array can further include means for preventing a charge buildup on junctions of the second plurality of capacitors. It can include a plurality of MOS transistors, means for coupling drain electrodes of the MOS transistors to the junctions, means for coupling the source electrodes thereof to the second point of reference potential, and means for coupling the gate electrodes to an enabling signal. Distributive stray capacitance can be present between the second coupling point and the second point of reference potential without material effect.

BRIEF DESCRIPTION OF THE DRAWINGS

Other objects, advantages, and features of this invention, together with its construction and mode of operation, will become more apparent from the following description, when read in conjunction with the accompanying drawings, in which.

PRIOR ART PCM CODER

A proposed design for a standard 15 segment approximation to the $\mu 255$ compression law coder for pulse-code modulation telephony was presented by Paul R. Gray, David A. Hodges, John P. Tsividis and Jacob Chacko, Jr., in an article entitled "Companded Pulse-Code Modulation Voice Codec Using Monolithic Weighted Capacitor Arrays", in the *IEEE Journal of Solid State Circuits*, December, 1975, pp. 497–499.

Figure 1:
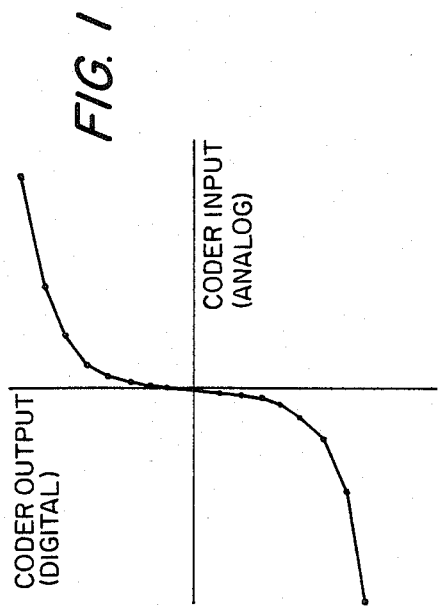
FIG. 1 is a diagram illustrating a 15 segment piecewise linear approximation to the $\mu 255$ compression law.

The fifteen segment approximation of the $\mu 255$ compression is shown in FIG. 1. Note that there are seven complete segments in the upper right quadrant and seven complete segments in the lower left quadrant, with one segment going through the origin.

Figure 2:
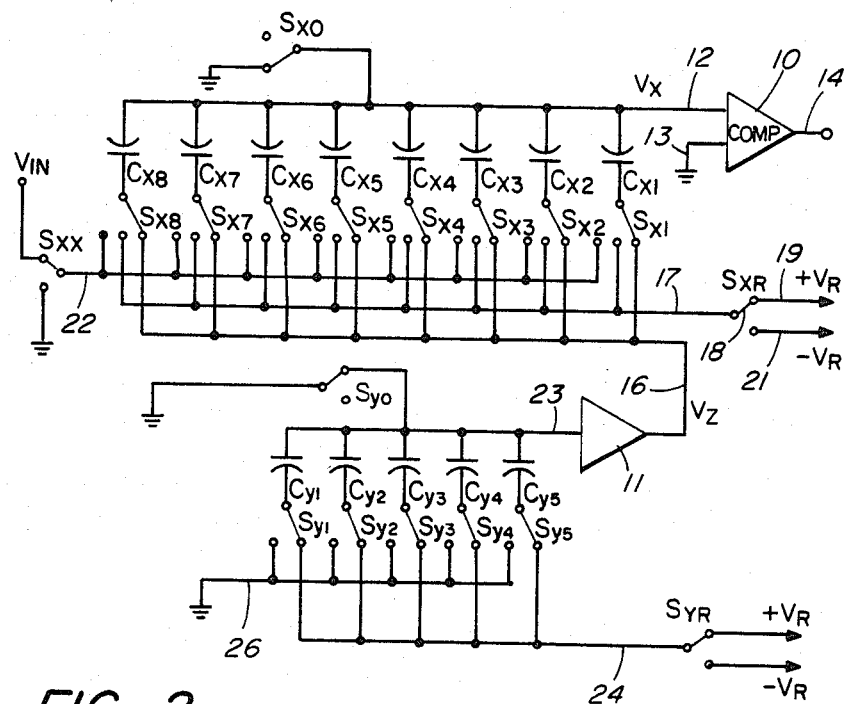
FIG. 2 is a diagram of a conceptual schematic of a charge redistribution $\mu 255$ encoder of the prior art.

The proposed coder of Gray et al., diagrammed in FIG. 2, utilizes two binary-weighted capacitor arrays, $C_{xi}$ and $C_{yi}$ as the key precision elements. Other elements shown in FIG. 2 include a binary comparator 10, a near unity gain buffer amplifier 11 with very high input impedance, reference sources $+V_R$ and $-V_R$ and numerous analog switches. Binary sequencing and control logic totalling about sixty gates and flip flops, and a digital clock (not shown), are required.

Referring to FIG. 2, the comparator 10 has a pair of input lines 12, 13 coupled thereto and an output line 14. The input line 13 is coupled to a point of reference potential, such as ground.

The input line 12, which carries a signal $V_X$, is coupled to an arm of a single-pole double-throw switch $S_{x0}$, one position of the arm being such as to couple the line 12 to a point of reference potential such as ground, the other position being such as to keep the line 12 from being coupled to such reference potential.

The line 12 is commonly coupled to one plate of each of a plurality of capacitors $C_{x1}$, $C_{x2}$, $C_{x3}$, $C_{x4}$, $C_{x5}$, $C_{x6}$, $C_{x7}$, and $C_{x8}$.

The remaining plates of the capacitors $C_{x1}$, $C_{x2}$, $C_{x3}$, $C_{x4}$, $C_{x5}$, $C_{x6}$, $C_{x7}$, $C_{x8}$ are coupled, respectively, to arms of three-position switches $S_{x1}$, $S_{x2}$, $S_{x3}$, $S_{x4}$, $S_{x5}$, $S_{x6}$, $S_{x7}$, $S_{x8}$, respectively. A first contact position for each of the switches $S_{x1}$, $S_{x2}$, $S_{x3}$, $S_{x4}$, $S_{x5}$, $S_{x6}$, $S_{x7}$, and $S_{x8}$ is coupled jointly to each other and to a line 16 upon which a signal $V_Z$ is impressed, which is coupled to the output of a near-unity gain buffer 11.

Intermediate contacts for each of the switches $S_{x1}$, $S_{x2}$, $S_{x3}$, $S_{x4}$, $S_{x5}$, $S_{x6}$, $S_{x7}$, $S_{x8}$ are jointly coupled, respectively, to a common line 17 which is connected to an arm 18 of a switch $S_{XR}$ which can be selectively positioned between a line 19 which is coupled to a voltage source $+V_R$, and to a line 21 which is coupled to a voltage source $-V_R$.

The third contacts for each of the switches $S_{x1}$, $S_{x2}$, $S_{x3}$, $S_{x4}$, $S_{x5}$, $S_{x6}$, $S_{x7}$, $S_{x8}$ are jointly connected together, respectively, to a line 22 which is coupled to an arm of a single-pole double-throw switch $S_{xx}$, which can be switched between a point of reference potential, such as ground and an input voltage $V_{IN}$.

An arm of a single-pole double-throw switch $S_{Y0}$ is coupled to a point of reference potential, such as ground. One position of the switch $S_{Y0}$ is unconnected; the remaining position is connected to a line 23 which is coupled to the input of the near-unity gain buffer 11.

The line 23 is coupled jointly to one plate of each capacitor $C_{y1}$, $C_{y2}$, $C_{y3}$, $C_{y4}$, $C_{y5}$. The other plates of the capacitors $C_{y1}$, $C_{y2}$, $C_{y3}$, $C_{y4}$, $C_{y5}$ are coupled, respectively, to an arm of single-pole double-throw switches $S_{y1}$, $S_{y2}$, $S_{y3}$, $S_{y4}$, $S_{y5}$. One contact of each of the switches $S_{y1}$, $S_{y2}$, $S_{y3}$, $S_{y4}$ and $S_{y5}$ is jointly coupled together to a line 24 which is coupled to an arm of a single-pole double-throw switch $S_{YR}$. The arm of the switch $S_{YR}$ can be selectively coupled between a voltage source $+V_R$ and a voltage source $-V_R$.

The other contacts of each of the switches $S_{y1}$, $S_{y2}$, $S_{y3}$, $S_{y4}$, $S_{y5}$ are coupled together to a common line 26 which is coupled commonly to a point of reference potential, such as ground.

The conversion proceeds as follows: Initially, the switch $S_{x0}$ is thrown to ground, and the switches $S_{x1}$ through $S_{x8}$ are positioned to receive the voltage source $V_{IN}$ (through the switch $S_{XX}$). The voltage $V_{IN}$ is thus stored on the capacitors $C_{x1}$ through $C_{x8}$. Next, the switch $S_{x0}$ is opened, and the switches $S_{x1}$ through $S_{x8}$ are thrown to ground (through the switch $S_{XX}$). Ideally, the sign of the voltage $V_X$, as detected by the comparator 10, is the negative of the sign of $V_{IN}$. This determines the sign bit of the PCM code. Also, the process just described, in effect, samples the signal, and the capacitor array is used as a holding capacitor. Next, the segment is determined by successively throwing $S_{xi}$ in order, starting with $S_{x1}$, from ground to the reference voltage until the sign of $V_x$ changes. (These switches are thrown to $+V_R$ if the sign of $V_{IN}$ was previously determined to be positive, and to $-V_R$ if it was determined to be negative.) If, for example, the comparator output changes after the switch $S_{Xn}$ is thrown, this would indicate that the input voltage lies within the nth segment (counting from the right) indicated in FIG. 1.

The final stage in the conversion is the determination of the step within the segment. The capacitor array $C_{yi}$ is used in this process. Initially, the switches $S_{yi}$ are all thrown to ground; that switch $S_{Xn}$ which was last thrown in the previous step is now switched to the voltage $V_Z$.

Next, the switch $S_{y0}$ is opened and the switches $S_{y1}$ through $S_{y5}$ are thrown sequentially from ground to $V_R$. The successive approximation algorithm is used for the in-chord coding, so that four clock periods are required to decide within which of the sixteen steps the sample lies. The setting of the switch $S_{yi}$ at this point denotes the step within the segment and the conversion is complete.

Such a voice coder is amenable to one-chip monolithic realization in standard MOS technology. In general, the top bank of capacitors, $C_{x1}$, $C_{x2}$, $C_{x3}$, $C_{x4}$, $C_{x5}$, $C_{x6}$, $C_{x7}$, and $C_{x8}$, determines in what segment the input voltage lies, while the bottom bank, $C_{y1}$, $C_{y2}$, $C_{y3}$, $C_{y4}$, and $C_{y5}$, pinpoints which one of 16 (or 31, for the segment through the origin) possible steps inside that segment is involved. The switches are used in a logical sequence for charge redistribution such that the comparator sees a match, or near equivalency. The final switch positions control the companded PCM output. Low power drain due to use of charge redistribution is achieved, in lieu of a high current drain when resistors are employed.

The top bank of capacitors $C_{x8}$, $C_{x7}$, $C_{x6}$, $C_{x5}$, $C_{x4}$, $C_{x3}$, $C_{x2}$, $C_{x1}$, shown in FIG. 2, are related by factors of 2 so that the top bank has relative sizes of 128, 64, 32, 16, 8, 4, 2, 1. The bottom bank of capacitors $C_{y5}$, $C_{y4}$, $C_{y3}$, $C_{y2}$, $C_{y1}$, shown in FIG. 2, have relative sizes of 8, 4, 2, 1, 1, the capacitor $C_{y1}$ (size 1) being charged only when the segment through the origin is applicable.

As suggested by James L. McCreary and Paul R. Gray, "ALL-MOS Charge Redistribution Analog-to-Digital Conversion Techniques—Part 1" in the *IEEE Journal of Solid State Circuits*, December, 1975, pp. 371-379, the binary weighted capacitor can be formed on an MOS chip as sums of basic unit capacitors, which values are relatively accurate. Thus, the circuit shown in FIG. 2 requires that a total of $$16 + \sum_{i=0}^{7} 2^i = 271$$

unit size capacitors be placed on the chip and be suitably connected.

Cameron, in U.S. Pat. No. 4,195,282 issued Mar. 25, 1980, discloses a charge redistribution circuit in which the bottom bank of capacitors and the associated buffer amplifier are eliminated, utilizing four selectable reference voltages in lieu of two. The total unit capacitor count in the Cameron patent is 255.

IN GENERAL

The 15 segment companding law, in use in the United States, calls for relative magnitude of voltage at the $r^{th}$ segment and $s^{th}$ step of $$V_c = -1 + 2^4 \left( \sum_{i=1}^{r} 2^i \right) - 2^r(2^4 - s) \tag{1}$$

where
$1 \leq r \leq 2^3$
$0 \leq s \leq 2^4$
and the $s^{th}$ step is also described by a binary train since $$s = \sum_{i=0}^{3} s_i 2^i$$

where $s_i = 0, 1$ for any $i$.

It is noted that the smallest step is of integer size two.

DESCRIPTION OF PREFERRED EMBODIMENT(S)

The embodiments disclosed herein are useful in applications similar to the foregoing circuits.

By means of capacitors, switches and reference voltages, each circuit creates an output proportional to $V_c$ that can be compared to the input voltage sample. This comparison is used in successive steps to encode the input voltage sample as an 8-bit companded, PCM digital output word. Used as a decoder, the comparison step is eliminated and the switches set once to get the desired output. Note that each term in equation (1) is an integral power of 2. Were the equation to be divided by $2^{12}$, then each term would be an integral power of ($\frac{1}{2}$). A circuit in accordance with this invention enables the formation of a series of terms related by factors of 2 in such a way that proper sums can be taken.

Each circuit disclosed herein to satisfy United States requirements can also be used, with small modifications, to satisfy the A law companding specification used in Europe and elsewhere. Relations similar to equation (1) can be written that also only involve powers of two. A different logic drives the circuit.

A circuit that can assemble terms related to factors of 2 can be used to form a linear PCM version of the input voltage sample. Hybrid operation is possible, wherein encoding is linear and decoding is companded or vice versa, with different logic.

Capacitive circuits, in accordance with this invention, can be used as a direct replacement for those previously employed. The first step in the successive approximation encoding determines the sign of the input voltage sample. Subsequent steps use $\pm V_r$ as a reference voltage depending on this first step. For decoding, the sign bit determines which sign of the $\pm V_r$ to use. Bias voltages have been uniformly incorporated in the capacitive circuits; the comparator has ground as the other input.

Figure 3:
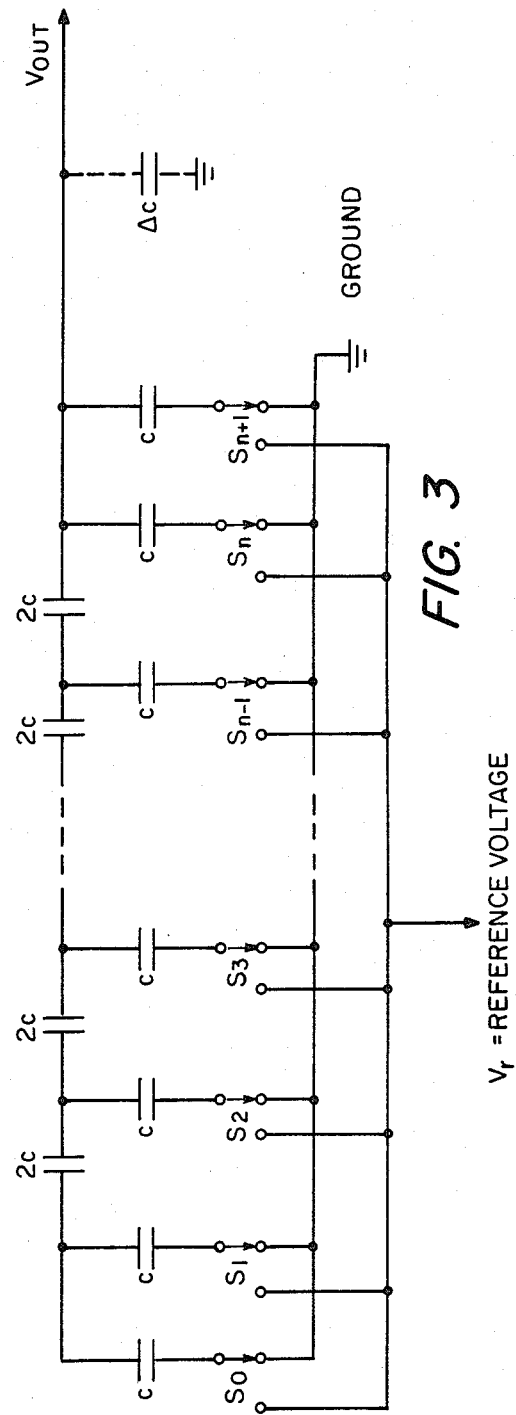
FIG. 3 is a diagram of a basic capacitive ladder circuit in accordance with one embodiment of this invention.

The basic capacitive array circuit of this invention is depicted in FIG. 3. Only two sizes of capacitors, C and 2C, are utilized, related by a factor of 2. In actual practice, a similar circuit uses a successive approximation technique to do digitizing of voice input signals. The negative of the input voltage sample is put on the capacitive array using a technique disclosed hereinafter. For decoding, the switches are set by the input digital signal and the output is used directly. An expression for the output voltage $V_{OUT} (=E_n)$ is given as follows $$V_{OUT} = \frac{V_r}{2^n \left( 3 + \frac{\Delta c}{c} \right)} \left( 2S_0 + S_{n+1} 2^n + \sum_{i=1}^{n} S_i 2^i \right). \tag{2}$$

where $S_i = 0, 1$ (depending on whether $V_r$ is switched out or in)

The foregoing equation for the output voltage $V_{OUT}$ is based on the following array of nodal current equations (integrated, so that they are expressed in terms of the charge held on each capacitor, c or 2c, entering the node):

$$0 = C(E_1 - S_0 V_r) + C(E_1 - S_1 V_r) + 2C(E_1 - E_2) \tag{3}$$

$$0 = 2C(E_i - E_{i-1}) + C(E_i - S_i V_r) + 2C(E_i - E_{i+1}) \text{ for } 2 \leq i \leq n-1$$

$$0 = 2C(E_n - E_{n-1}) + C(E_n - S_n V_r) + C(E_n - S_{n+1} V_r) + \Delta C(E_n)$$

where $S_i = 0,1$ (depending on whether $V_r$ is switched out or in)

$E_i$ = voltage at the $i^{th}$ node

The equations for all the internal nodes are of similar form; only the end nodes differ. The solution of this array is facilitated by multiplying each row by a power of two equal to the nodal index. The array is summed to achieve the results shown in (2) for output voltage.

In the analytic form for voltage output shown in (2), all powers of two are represented in terms of individual switch positions, $S_i$. Thus, arbitrary sums of powers of two can be formed as desired. The array can be used to perform linear PCM encoding by such a straightforward sum of powers of two. This application is discussed in greater detail hereinafter. However, it is desirable to directly utilize the companded form of PCM, thereby avoiding a separate conversion circuit. It is noted that the effect of stray capacitance at the output is minor and appears only as a universal multiplying factor. When a permanent bias voltage is desired, it can be inserted by a permanent connection in place of a switch. For example, $S_0$ can be permanently tied to $-V_r$ and $S_1$ permanently tied to ground to yield an effective bias of $-1$. Other arrangements can be made for higher powered bias values.

Another feature of the basic capacitance array is the constant impedance seen at each node. Viewing the node as a whole, an impedance is seen due to a total capacitance of $3C$. This is composed of a single capacitor, C, in shunt plus single capacitance values, C, looking in either direction along the chain. In fabricating such an array, the two sizes of capacitance using the same unit capacitor can be achieved in several ways. Either a series or parallel combination of unit capacitors can be used to create the value of the other capacitor required.

There are two single ladder circuit forms, similar to that depicted in FIG. 3, that can be applied in the same fashion as the Gray et al. and the Cameron capacitance arrays have been used for A/D conversion in the past.

Figure 4:
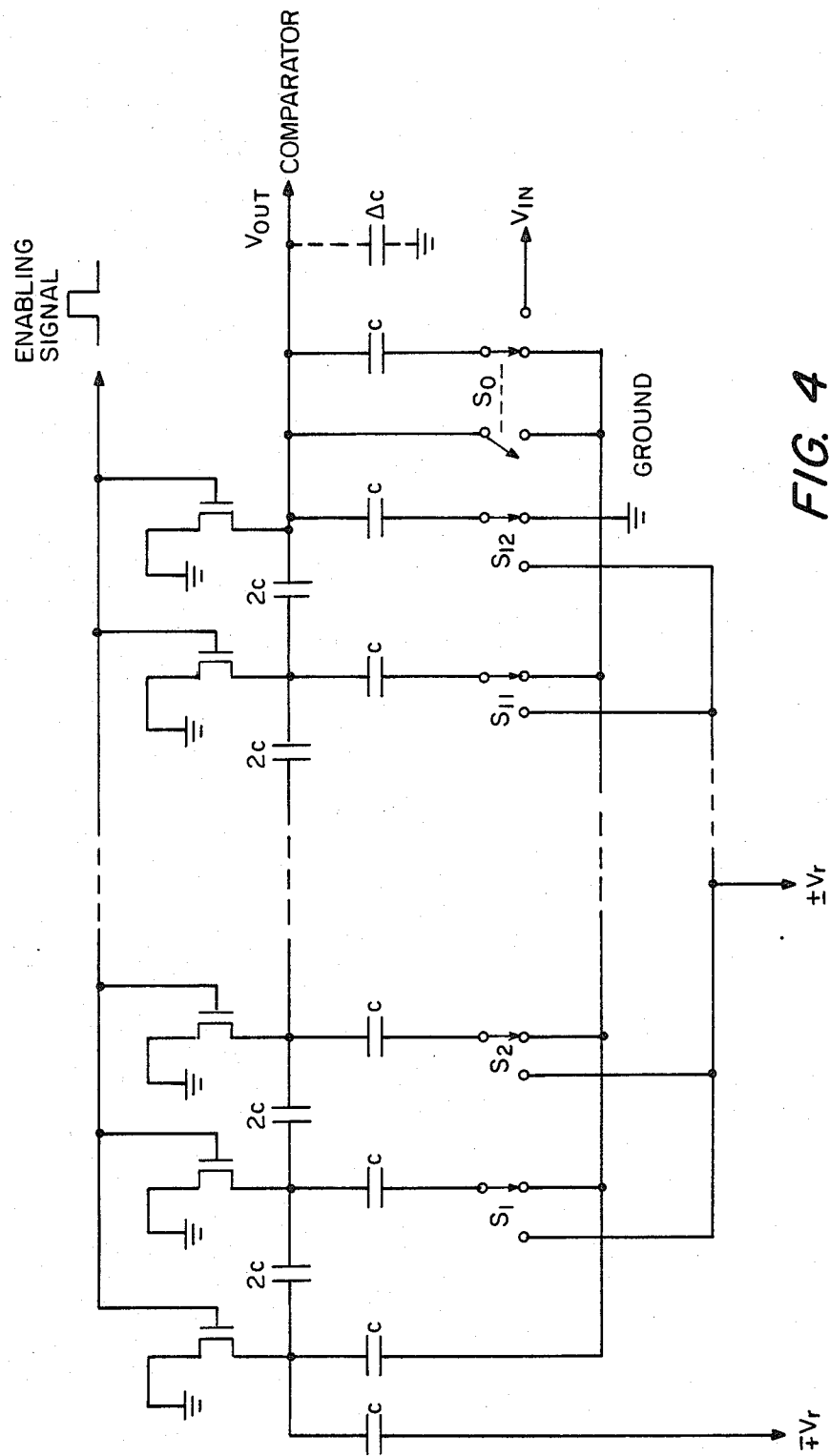
FIG. 4 is a diagram of a thirteen stage capacitive ladder array in accordance with this invention.

The thirteen stage capacitive ladder circuit array, a one-for-one replacement, shown in FIG. 4, can be used directly in the A/D converters previously used by Gray et al. and Cameron. A single bank of capacitors is used with only two sizes of capacitors and no resistors for bias purposes. Only 39 unit capacitors are used to realize its construction as compared to 271 and 255 for the previous designs of Gray et al., and Cameron, respectively.

The circuit of FIG. 4 is provided with a plurality of MOS transistors, the source electrodes of which are coupled to the nodal connections of the capacitors, and the drain electrodes of which are coupled to a source of reference potential such as ground. A pulse is applied to the gate electrodes of the MOS transistors to initialize the capacitor array to prevent charge buildup. Thus, to enable the capacitor array to be utilized in integrated circuit format, the capacitor nodes have to be periodically discharged; this is achieved via the MOS transistors.

An expression for the voltage output of the circuit depicted in FIG. 4, in terms of switch positions, is shown in equation (4) below:

$$V_{OUT} = \frac{1}{\left(3 + \frac{\Delta c}{c}\right)} \left\{ -V_{IN} + \frac{(\pm V_r)}{2^{12}} \left( -1 + \sum_{i=1}^{12} S_i 2^i \right) \right\} \quad (4)$$

where $S_i = 0,1$ (depending on whether $V_r$ is switched out or in)

All powers of two are available by separate switch settings. When encoding, the negative of the input voltage sample is inserted into the array by operation of switch $S_0$ which simultaneously places the input voltage across the shunt capacitor and shorts the rest of the bank to zero value, performing reset, sample, and hold in one step.

The first step in a successive approximation encoding technique consists of determining the sign of the input voltage sample. Thereafter, either plus or minus values of the voltage reference, $\pm V_r$, are used to complete the successive approximation cycle.

When decoding, the switches are set by the input digital word and the output is used directly.

The leftmost shunt capacitor (FIG. 4) is used for a bias value by routing to $\pm V_r$, the opposite sign of the switched voltage.

The operation of the thirteen stage capacitive array to achieve a companded PCM output is based on a rearrangement of the companded voltage law (equation 1) as follows:

$$V_c = -1 + 2^4 \left( \sum_{i=1}^{r} 2^i \right) - 2^r \sum_{i=0}^{3} s_i 2^i \quad (5)$$

where the counter step $$s' = 2^4 - s = \sum_{i=0}^{3} s_i' 2^i$$

$s'_i = 0,1$ = binary components of counter step $s'$ and $0 \leq s \leq 16$ Finding the proper segment to oppose the input voltage is represented by the first two terms of the companding law, and is accomplished with the circuit shown in FIG. 4 by throwing switches in sequence starting with the switch $S_1$ and proceeding up through a value that just exceeds $V_{IN}$. The highest switch closed has an order $r+4$. As indicated by Cameron, U.S. Pat. No. 4,195,282, the subject matter of which is incorporated herein by reference, for fast operation, a successive approximation approach achieves the same end result.

Having determined the proper segment, r, in which the signal lies, the step, s', inside that segment is reached by opening one or more of the four switches immediately below the highest one closed, as represented by the last term in the expression for companded voltage of equation (5). In effect, the counter step, s', descends from the top voltage level of the segment instead of ascending from the bottom. When the closest match is obtained, the output voltage approaches zero. Then, the switch positions are read as a logical statement of the desired companded PCM digital word.

Figure 5:
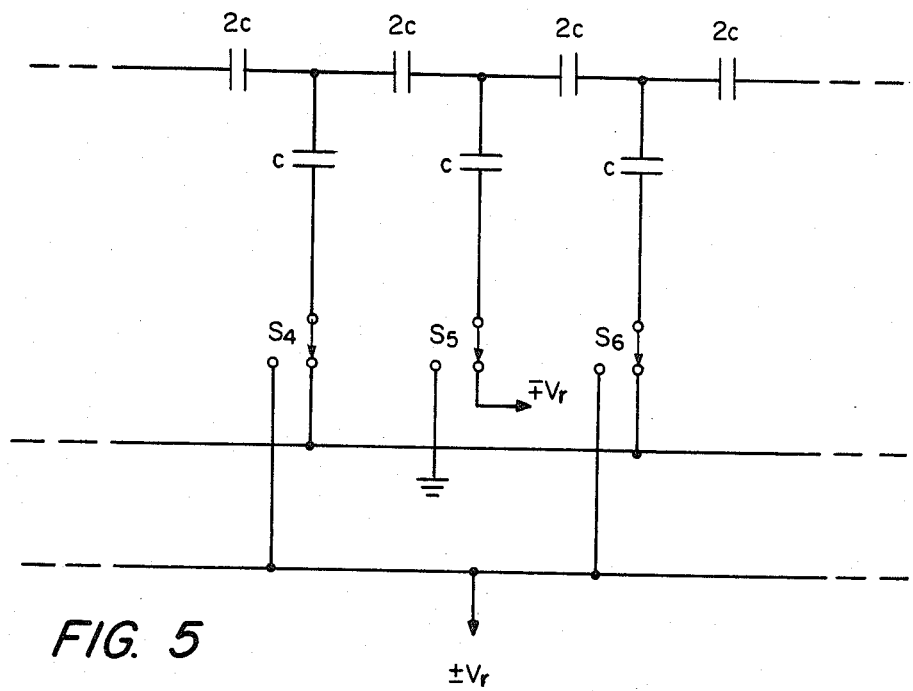
FIG. 5 is a diagram of another form of single-chain ladder circuit in accordance with the invention.

Another form of single-chain ladder approach is realized by a small alteration of circuit as shown in FIG. 5. The only modification resides in the voltages used by the switch $S_5$ which changes the bias voltage as follows:

$$V_{OUT} = \frac{1}{\left(3 + \frac{\Delta c}{c}\right)} \left\{ -V_{IN} + \frac{(\pm V_r)}{2^{12}} \left( -33 + \sum_{i=1}^{12} S_i 2^i \right) \right\} \quad (6)$$

where $S_i = 0,1$ as before in FIG. 4 except $S_5 = 1$ when switched to ground.

With this special circuit, fewer switches need be closed to determine the segment, and a more direct output of the step, s, appropriate to the input voltage is achieved. The same thirty-nine low unit capacitor parts count is realized with this form.

The operation of this circuit to achieve companded PCM is clarified by the following equation, another version of the companded voltage law:

$$V_c = -33 + 2^r \left( 2^4 + \sum_{i=0}^{12} s_i 2^i \right) \quad (7)$$

where $s_i = 0,1 =$ binary components of step s $$s = \sum_{i=0}^{3} s_i 2^i$$

$$0 \leq s \leq 2^4$$

The circuit of FIG. 5 is matched to the companding law of equation (7). In operation, a single switch is thrown to identify the correct segment. This is performed by successive approximation as in the embodiment of FIG. 4. However, the end point for the first cycle is a voltage slightly smaller than the input voltage sample. The index of the switch is equal to $r+4$. The second successive approximation cycle identifies the step positions, s, by throwing additional switches located in the four index positions immediately below the segment determining switch. In this manner, a direct output of the step value is obtained and only a single switch need be closed to set the circuit in the proper segment.

Chains or ladders can be cascaded to achieve a product effect, as individual chains present identical impedances at each stage.

Figure 6:
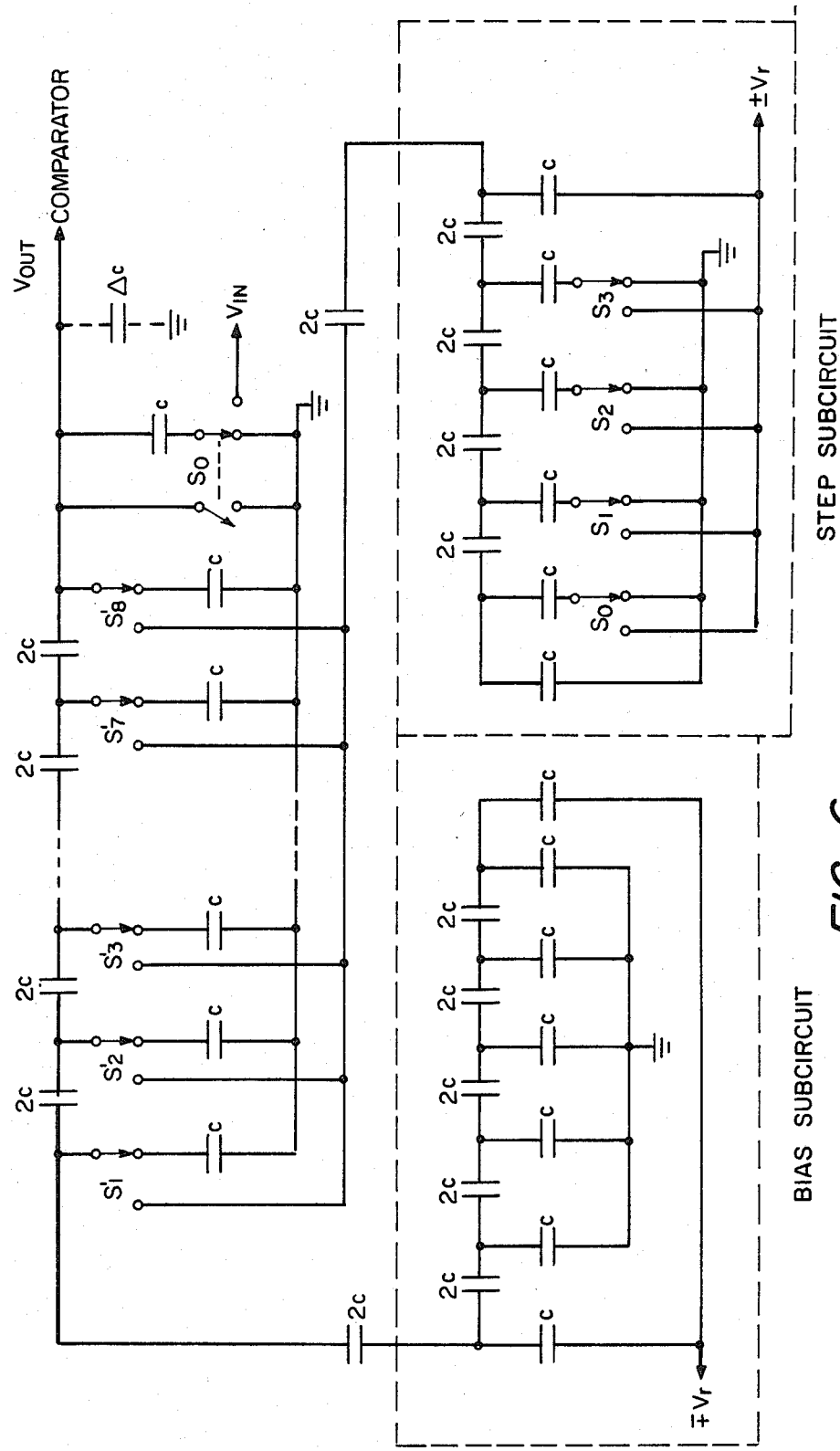
FIG. 6 is a diagram of a switched cascade circuit in accordance with this invention.

The companding voltage law shown in equation (7) can be viewed as a product of two terms, provided that the bias is handled separately. The circuit shown in FIG. 6 is an implementation that creates the voltage for comparison in that product fashion. The various subcircuits for step voltage and bias are arranged such that they present the proper impedance to the main chain and vice versa. The expression for voltage output of this circuit appears in equation (8) and the similarity to the companding law of equation (7) is readily apparent.

$$V_{OUT} = \frac{1}{\left(3 + \frac{\Delta c}{c}\right)} \left\{ -V_{IN} + \frac{(\pm V_r)}{2^{13}} \left( -33 + 2^j \left[ 2^4 + \sum_{i=0}^{3} s_i 2^i \right] \right) \right\} \quad (8)$$

$S'_i = 0$ for $i \neq J$ where $S_i = 0,1$ (depending on whether $\pm V_r$ is switched out or in)

$S'_i = 0$ for $i = j$ $S'_j = 1$ $j =$ an integer index representing the single switch in the bank of switches $S'_i$ that is thrown to the step subcircuit output.

This switched cascaded form utilizes several more additional components (58 unit capacitors) than the first two circuits disclosed. It illustrates a principle of how to achieve simplified products without using buffers.

Figure 7:
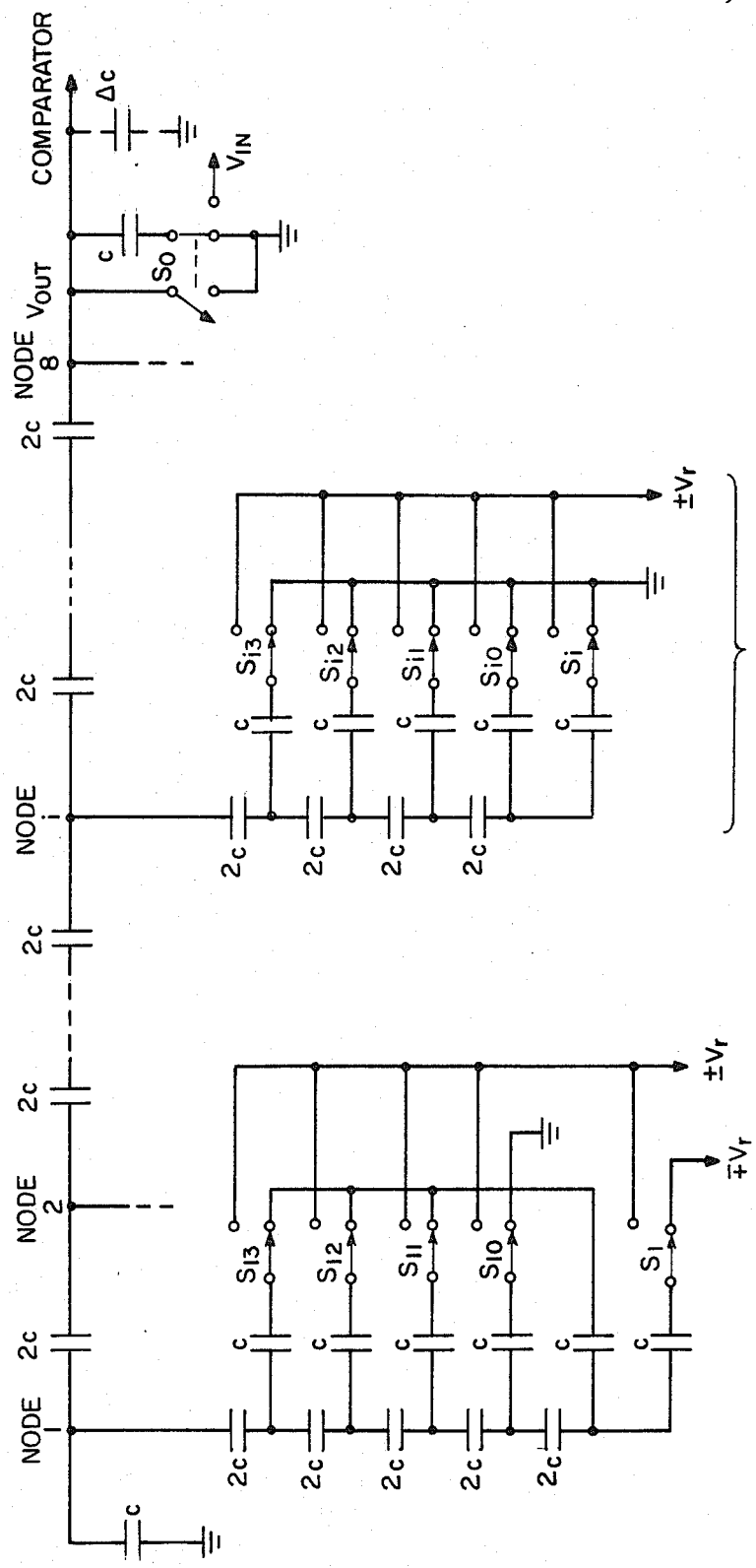
FIG. 7 is a diagram of an "unswitched" cascaded circuit in accordance with this invention, the circuits of FIGS. 3, 4, 6, and 7 illustrating stray capacitance at the output thereof by the symbol $\Delta C$.

An "unswitched" embodiment, that is, one in which each node has its own subcircuit chain feeding it, is shown in FIG. 7. In a sense, it is the capacitive equivalent of the multiple resistor ladder circuit used in modern PCM encoders. It is modeled after the companding voltage law as shown below:

$$V_c = -1 + 2^4 \left( -2^r + \sum_{i=1}^{r} 2^i \right) + 2^r \sum_{i=0}^{3} s_i 2^i \quad (9)$$

where $s_i = 0,1 =$ binary components of step s $$s = \sum_{i=0}^{3} s_i 2^i$$

$$0 \leq s \leq 2^4$$

In this form of the companding law, integral powers of two are added to a level equal to the segment and then step sizes are added as appropriate. In the form shown, an implementation in a single ladder probably requires double capacitors at each shunt position of a node. But that is not required in the implementation shown in FIG. 7.

The output voltage of FIG. 7 is shown in equation (10) as follows:

$$V_{OUT} = \frac{1}{\left(3 + \frac{\Delta c}{c}\right)} \left\{ -V_{IN} + \frac{(\pm V_r)}{2^{12}} \left[ -1 + \sum_{i=1}^{8} 2^i \left( S_i + \sum_{j=0}^{3} S_{ij} 2^j \right) \right] \right\} \quad (10)$$

= output voltage for the multiple ladder cascade (FIG. 7)

where $S_{ij} = 0,1$ (depending on whether $\pm V_r$ is switched out or in)

$S_i = 0,1$ (on the same basis as $S_{ij}$ except that $S_1$ switches to $\mp V_r$ for $S_1 = 0$)

The bias of $-1$ is provided in the first subcircuit section by the special circuit arrangement for switch $S_1$. In operation, each subcircuit is operated as a unit to achieve the step appropriate to that segment. When the voltage to be encoded lies above that segment, all switches in the subcircuit are closed and the result is a complete power of two contribution to the output sum. In other words, a matching voltage is created by closing switches in successively higher order subcircuits until the proper segment is reached, at which point the proper step inside this segment is determined. There is no tracking error in the sense that an input voltage cannot be bracketed. However, the total components count (123 unit capacitors) is considerably higher.

In accordance, with this invention, switched capacitive arrays can be used for digitizing to obtain a D3 specification (applicable in the United States) companded PCM digital word output. The single-chain ladder approaches of FIGS. 4 and 5 are more universally applicable and have the fewest components count (39 unit capacitors). The multiple-ladder cascaded array of FIG. 7 has application in precision A/D work where components count is not as critical.

A principal advantage of this invention is that only two sizes of capacitors are used in its implementation. Thus, capacitive values can be chosen in the center of the desirable range for IC realization. RC time constants for all the stages are similar so that timing is uniform between the various steps of a successive approximation cycle.

In summary, only two different sizes of capacitors are required (although, by equivalence, one capacitor can represent one size, and two like capacitors can be coupled in series or parallel to provide equivalent values of half or double the one size).

What is claimed is:

1. A capacitor array for a companded pulse-code modulation voice codec comprising
    a first plurality m of capacitors having a common capacitance C, each, and each of said capacitors having a first plate and a second plate;
    a plurality of switching means for individually and selectively coupling said first plates of said capacitors to either a first point of reference potential or to a second point of reference potential; and
    a second plurality n of capacitors having a common capacitance 2C, each, coupled in series to form a plurality (n+1) of junctions, each of said junctions being coupled to a separate one of said second plates,
    a plurality of MOS transistors, each having a drain electrode, a source electrode, and a gate electrode;
    means for coupling said drain electrodes, respectively, to said junctions;
    means for coupling said source electrodes to said first point of reference potential; and
    means for coupling said gate electrodes to an enabling signal,
    wherein m and n are integers, and wherein the value of 2C is twice the value of C.

2. A capacitor array for a companded pulse-code modulation voice codec comprising
    a first plurality m of capacitors having a common capacitance C, each, and each of said capacitors having a first plate and a second plate;
    a plurality of switching means for individually and selectively coupling said first plates of said capacitors to a first point of reference potential of a given polarity or to a second point of reference potential;
    a first capacitor having a like capacitance C having a first plate adapted to be coupled to said second point of reference potential and having a second plate;
    a second capacitor having a like capacitance C having a first plate adapted to be coupled to a third point of reference potential equal in magnitude but opposite in polarity to that of said first point of reference potential, and having a second plate;
    a third capacitor having a like capacitance C having a first plate and a second plate;
    a first switch having an arm coupled to said first plate of said third capacitor, said arm being adapted to be coupled to either a first terminal or a second terminal;
    means for coupling said second plates of said first capacitor and said second capacitor together at a first coupling point;
    means for coupling said second plate of one of said first plurality of capacitors and said second plate of said third capacitor together at a second coupling point;
    a second plurality m of capacitors having a common capacitance 2C, each coupled in series to form a plurality (m+1) of junctions, each of said junctions being coupled to a respective one of said second plates of said first plurality of capacitors and said second capacitor;
    a second switch having an arm coupled to said second coupling point and being adapted to be coupled to said second point of reference potential,
    said first switch and said second switch being so ordered that
    (a) when said arm of said first switch is coupled to said first terminal, said arm of said second switch is open circuited, and
    (b) when said arm of said first switch is coupled to said second terminal, said arm of said second switch is coupled to said second point of reference potential; and
    means for coupling said first terminal to said second point of reference potential,
    said second terminal being adapted to receive an input signal.

3. The capacitor array as recited in claim 2 further comprising means for preventing a charge buildup on junctions of said second plurality of capacitors.

4. The capacitor array as recited in claim 2 further comprising
    a plurality of MOS transistors, each having a drain electrode, a source electrode, and a gate electrode;
    means for coupling said drain electrodes, respectively, to said junctions;
    means for coupling said source electrodes to said second point of reference potential; and
    means for coupling said gate electrodes to an enabling signal.

5. The array as recited in claim 6 wherein m=12.

6. The array as recited in claim 2 wherein distributive stray capacitance can be present between said second coupling point and said second point of reference potential without material effect.

7. A capacitor array for a companded pulse-code modulation voice codec comprising
    m capacitors, where m≧5, having a common capacitance C, each, and each of said capacitors having a first plate and a second plate;
    switching means for individually and selectively coupling said first plate of the first, second, third, fourth, excluding the fifth, and thereafter up to the $m^{th}$ capacitors of said m capacitors to a first point of reference potential of a given polarity and to a second point of reference potential, and for selectively coupling said first plate of the fifth of said m capacitors to said second point of reference potential and to a third point of reference potential equal in magnitude but opposite in polarity to that of said first point of reference potential;

a first additional capacitor having a like capacitance C having a first plate adapted to be coupled to said second point of reference potential and having a second plate;

a second additional capacitor having a like capacitor C having a first plate adapted to be coupled to said third point of reference potential, and having a second plate;

a third additional capacitor having a like capacitance C having a first plate and a second plate;

a first switch having an arm coupled to said first plate of said third additional capacitor, said arm being adapted to be coupled to either a first terminal or a second terminal;

means for coupling said second plates of said first additional capacitor and said second additional capacitor together at a first coupling point; P1 means for coupling said second plate of one of said m capacitors and said second plate of said third additional capacitor together at a second coupling point;

m capacitors having a common capacitance 2C, each, each coupled in series to form (m+1) junctions, each of said junctions being coupled to a respective one of said second plates of said m capacitors having said common capacitance C each, and said second plate of said second capacitor;

a second switch having an arm coupled to said second coupling point and being adapted to be coupled to said second point of reference potential, said first switch and said second switch being so ordered that (a) when said arm of said first switch is coupled to said first terminal, said arm of said second switch is open circuited, and (b) when said arm of said first switch is coupled to said second terminal, said arm of said second switch is coupled to said second point of reference potential; and means for coupling said first terminal to said second point of reference potential, said second terminal being adapted to receive an input signal.

8. The capacitor array as recited in claim 7 further comprising means for preventing a charge buildup on junctions of said second plurality of capacitors.

9. The capacitor array as recited in claim 7 further comprising a plurality of MOS transistors, each having a drain electrode, a source electrode, and a gate electrode;

means for coupling said drain electrodes, respectively, to said junctions;

means for coupling said source electrodes to said second point of reference potential; and means for coupling said gate electrodes to an enabling signal.

10. The array as recited in claim 7 wherein m=12.

11. The array as recited in claim 7 wherein distributive stray capacitance can be present between said second coupling point and said second point of reference potential without material effect.

12. A capacitor array for a companded pulse-code modulation voice codec comprising a first plurality of eight capacitors having a common capacitance C, each, and each of said capacitors having a first plate and a second plate;

means for coupling all of said first plates of said eight capacitors together to a first point of reference potential;

a second plurality of eight capacitors having a common capacitance 2C, each coupled in series to form nine junctions;

switching means for individually and selectively coupling eight contiguous of said nine junctions to said second plates of said first plurality of eight capacitors, or to a first common line;

a first additional capacitor having a like capacitor C having a first plate and a second plate;

a first switch having an arm coupled to said first plate of said first additional capacitor, said arm being adapted to be coupled to either a first terminal or a second terminal;

a second switch having an arm coupled to said second plate of the eighth capacitor of said first plurality of capacitors and being adapted to be coupled to said first plates of said first plurality of capacitors;

said first switch and said second switch being so ordered that (a) when said arm of said first switch is coupled to said first terminal, said arm of said second switch is open circuited, and (b) when said arm of said second switch is coupled to said second terminal, said arm of said second switch is coupled to said first plates of said first plurality of capacitors;

means for coupling said second plate of said first additional capacitor to said second plate of said eighth capacitor of said first plurality of capacitors;

means for coupling said first terminal to said first plates of said first plurality of capacitors, said second terminal being adapted to receive an input signal;

a step subcircuit comprising a third plurality of four capacitors having a common capacitance C, each, and each having a first plate and a second plate, a like third plurality of four switches, each having an arm coupled to a respective first plate of said third plurality of four capacitors, adapted to switch between respective terminals for receiving a reference voltage of a given polarity, and to a first point of reference potential, a second additional capacitor having a capacitance C coupled across a first of said third plurality of four capacitors and said first point of reference potential, a third additional capacitor having a capacitance C having a first plate and a second plate, means for coupling said first plate of said third additional capacitor to said reference voltage of a given polarity, and a fourth plurality of five capacitors having a common capacitance 2C, each, each coupled in series to form six junctions, one junction of which is coupled to said second plate of said first capacitor of said third plurality of four capacitors, a second junction of which is coupled to said second plate of a second capacitor of said third plurality of four capacitors, a third junction of which is coupled to said second plate of a third capacitor of said third plurality of four capacitors, a fourth junction of which is coupled to said second plate of a fourth capacitor of said third plurality of four capacitors, a fifth junction of which is coupled to said second plate of said third additional capacitor, and a sixth junction of which is coupled to said first common line; and a bias subcircuit comprising
- a fifth plurality of five capacitors having a common capacitance C, each, and each having a first plate and a second plate, a fourth additional capacitor having a capacitance C and having a first plate and a second plate, a fifth additional capacitor having a capacitance C and having a first plate and a second plate,
- means coupling said first plates of said fifth plurality of five capacitors to a first point of reference potential,
- means for coupling said first plates of said fourth additional capacitor and said fifth additional capacitor to a reference voltage that is equal in magnitude but opposite in polarity to said reference voltage of a given polarity,
- a sixth plurality of five capacitors having a capacitance of 2C, each, coupled in series to form six junctions, one junction of which is coupled to both said second plate of said fourth additional capacitor and to the remaining ninth junction of said second plurality of eight capacitors, a second junction of which is coupled to said second plate of a first capacitor of said fifth plurality of five capacitors, a third junction of which is coupled to said second plate of a second capacitor of said fifth plurality of five capacitors, a fourth junction of which is coupled to said second plate of a third capacitor of said fifth plurality of five capacitors, a fifth junction of which is coupled to said second plate of a fourth capacitor of said fifth plurality of five capacitors, and a sixth junction of which is coupled to both said second plate of a fifth capacitor of said fifth plurality of five capacitors and to said second plate of said fifth additional capacitor.

* * * * *